(12) United States Patent
Lu et al.

(10) Patent No.: US 11,873,551 B2
(45) Date of Patent: Jan. 16, 2024

(54) ULTRA-FLAT AND LOW-FRICTION METALLIC GLASS FILM AND A METHOD FOR PREPARING THE SAME

(71) Applicant: City University of Hong Kong, Hong Kong (HK)

(72) Inventors: Jian Lu, Hong Kong (HK); Jialun Gu, Hong Kong (HK); Yan Bao, Hong Kong (HK)

(73) Assignee: City University of Hong Kong, Hong Kong (HK)

( * ) Notice: Subject to any disclaimer, the term of this patent is extended or adjusted under 35 U.S.C. 154(b) by 0 days.

(21) Appl. No.: 17/705,367

(22) Filed: Mar. 27, 2022

(65) Prior Publication Data

US 2023/0304142 A1    Sep. 28, 2023

(51) Int. Cl.
| | | |
|---|---|---|
| C22C 45/04 | (2006.01) | |
| C22C 45/10 | (2006.01) | |
| C23C 14/35 | (2006.01) | |
| C23C 14/16 | (2006.01) | |
| C22C 45/00 | (2023.01) | |

(52) U.S. Cl.
CPC ............ *C23C 14/35* (2013.01); *C22C 45/001* (2013.01); *C22C 45/04* (2013.01); *C22C 45/10* (2013.01); *C23C 14/16* (2013.01)

(58) Field of Classification Search
None
See application file for complete search history.

(56) References Cited

U.S. PATENT DOCUMENTS

2013/0105300 A1* 5/2013 Jang ..................... C23C 14/028
                                                    204/192.15
2020/0056277 A1* 2/2020 Kim ....................... C22C 45/08

OTHER PUBLICATIONS

Zeman et al., Amorphous Zr—Cu thin-film alloys with metallic glass behavior, Dec. 9, 2016, Journal of Alloys and Compounds, (Year: 2016).*
Shu-Wei Liu et al., Robust microscale superlubricity under high contact pressure enabled by graphene-coated microsphere, 2017, Natural Communications, 8:14029, DOI: 10.1038.
Jinjln Li et al.,Superlubricity of Graphite Sliding against Graphene Nanoflake under Ultrahigh Contact Pressure, Advance Sciences, 2018, 5, 1800810.
Yanmin Liu et al., Interlayer Friction and Superlubricity in Single-Crystalline Contact Enabled by Two-Dimensional Flake-Wrapped Atomic Force Microscope Tips, ACS Nano 2018, 12,p. 7638-7646.

(Continued)

*Primary Examiner* — Mary I Omori
(74) *Attorney, Agent, or Firm* — Idea Intellectual Limited; Margaret A. Burke; Sam T. Yip

(57) ABSTRACT

An ultraflat and ultralow-friction metallic glass thin film is fabricated. The metallic glass thin film is a binary alloy, wherein a content of one metal element of the binary alloy is between 45 atomic % and 64 atomic %. The metallic glass thin film has an atomically smooth surface with a surface roughness $R_a$ less than 0.1 nm and a total height of profile $R_t$ less than 0.15 nm; the friction coefficient is below $1 \times 10^{-2}$. Due to the metallic glass thin film being treated by ion bombardment, the metallic glass thin film is thermally ultrastable.

10 Claims, 12 Drawing Sheets

(56) References Cited

OTHER PUBLICATIONS

Yiming Song et al., Robust microscale superlubricity in graphite/hexagonal boron nitride layered heterojunctions, Nature Materials, V.17, Oct. 2018, p. 894-899.
Mengzhou Liao et al., Ultra-low friction and edge-pinning effect in large-lattice-mismatch van der Waals heterostructures, Nature Materials, 2021, DOI 10.1038/s41563-021-01058-4.

* cited by examiner

ULTRA-FLAT AND LOW-FRICTION METALLIC GLASS FILM AND A METHOD FOR PREPARING THE SAME

TECHNICAL FIELD

The present invention relates to metallic glasses and their preparation methods and, more particularly, to metallic glasses that are ultraflat and provide ultralow-friction interfaces.

BACKGROUND

Friction accounts for approximately one—fifth of global energy consumption, and undesired friction suppression is a major challenge in mechanical engineering. Developing materials with structural superlubricity, which is defined as a frictionless state between rigid incommensurate surfaces, is an important strategy for reducing friction and wear. While superlubricity may be achieved through the use of liquid lubricants, there are applications where liquid lubricants are undesirable, such as in outer space vehicles and in micro and nanoelectromechanical systems.

Thus, there is a need in the art for large-scale homogeneous materials with structural superlubricity. Such low-friction materials can serve as frictionless coatings resulting in both energy savings and enhanced device functionality. The present invention addresses this need.

SUMMARY OF THE INVENTION

Accordingly, the present invention provides atomically smooth, hard, metallic glasses as low friction interfaces between components. In one aspect, an ultraflat and ultralow-friction metallic glass thin film is fabricated. The metallic glass thin film is a binary alloy, wherein a content of one metal element of the binary alloy is between 45 atomic % and 64 atomic %. The metallic glass thin film has an atomically smooth surface with a surface roughness $R_a$ less than 0.1 nm and a total height of profile $R_t$ less than 0.15 nm; the friction coefficient is below $1\times10^{-2}$. Due to the metallic glass thin film being treated by ion bombardment, the metallic glass thin film is thermally ultrastable.

In an aspect of the invention, there is provided a low-friction metallic film with atomically smooth surface. Binary alloys with the concentration of the primary element in the range of 45~64 atomic % are deposited as the ultraflat and ultralow-friction metallic films via the proposed method. The atomically smooth metallic surface is realized by in situ argon ion bombardment as an extreme relaxation process for metallic glass. The surface roughness $R_a$ and the total height of profile $R_t$ of the ultraflat metallic films is less than 0.1 nm and 0.15 nm, respectively. The atomically smooth surfaces of the metallic glass films are even comparable to that of an ultraflat monocrystalline domain on highly oriented pyrolytic graphite and superior to the commercial ultraflat Si wafer. Ultralow friction, later defined as the superlubricity state, could be realized by the atomically smooth metallic films, with a friction coefficient below $1\times10^{-2}$. The friction between the ultraflat metallic films and two-dimensional materials is highly isotropic, without twist-angle dependent friction anisotropy. The homogeneous ultralow-friction of the ultraflat metallic glass could be realized at engineering scale (several inches in diameter). Besides, the ultraflat metallic films exhibit much higher hardness and modulus than the metallic films prepared by conventional method. The ultraflat metallic films exhibits much higher thermodynamic and kinetic stabilities compared to the metallic films prepared by conventional method.

In another aspect, the metallic glass thin film binary alloy is a copper-zirconium alloy in which copper is present in an amount from 45 to 64 atomic % and zirconium in an amount from 55 to 36 atomic %.

In another aspect, the metallic glass thin film binary alloy is a nickel-niobium alloy in which nickel is present in an amount from 45 to 64 atomic % and niobium in an amount from 55 to 36 atomic %.

In another aspect, the metallic glass thin film includes a substrate such as a metal surface, silicon, mica, a MEMS device, or a frictional surface of a mechanical assembly.

In another aspect, the metallic glass thin film has a glass transition temperature of at least 820K.

In another aspect, the metallic glass thin film has a hardness of at least 10 GPa and a Young's modulus of at least 150 GPa.

In another aspect, the present invention provides a frictional interface with superlubricity and exhibiting frictional isotropy in which one interface surface is the inventive metallic glass thin film. The second interface configured to contact the first interface, is a surface selected from the metallic glass thin film, graphite, graphene, $MoS_2$, hexagonal boron nitride, or $WS_2$.

DETAILED DESCRIPTION

Figure 1:
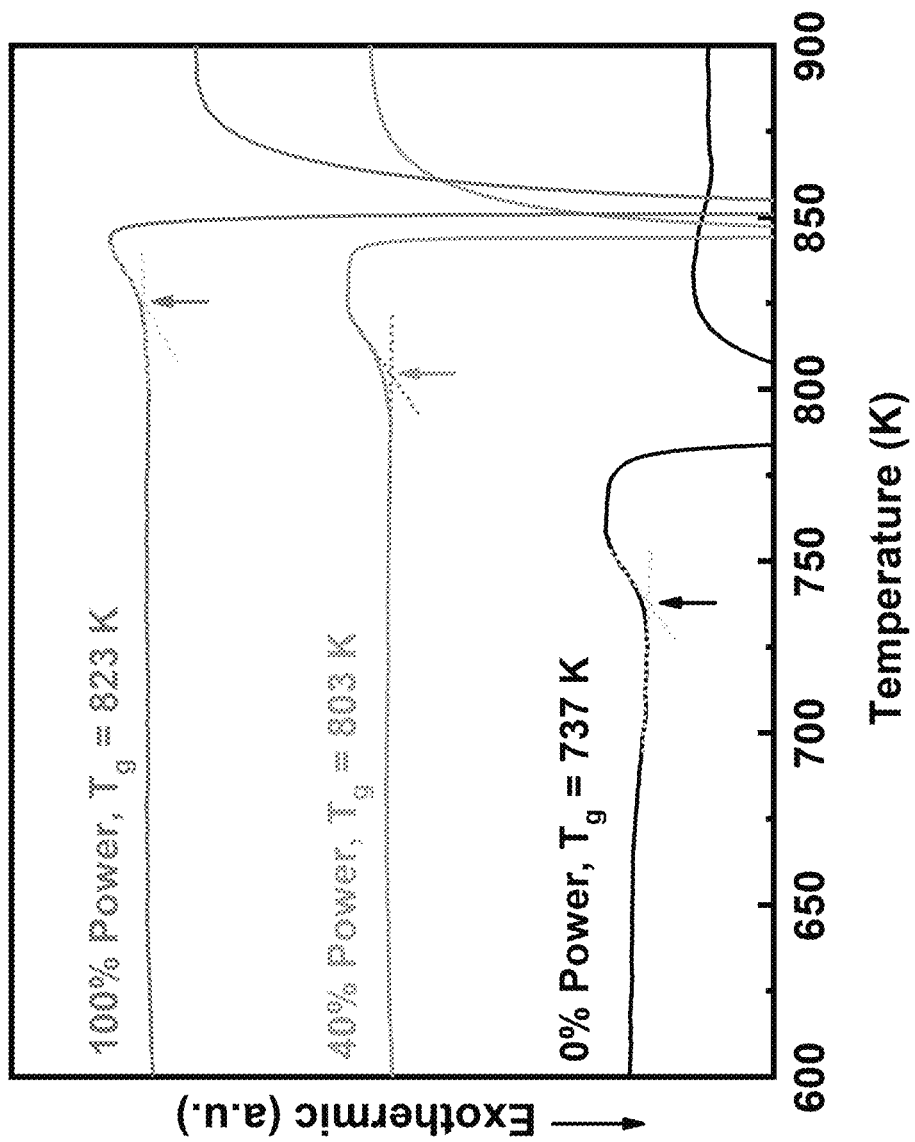
FIG. 1 depicts differential scanning calorimetry heat flow curves of Cu—Zr metallic glass films deposited at different powers of argon ion bombardment.

Interfaces with superlubricity can reduce the energy dissipated in sliding contacts while also minimizing surface wear. While superlubricity is possible on a microscopic level, scaling up to larger interfaces has proven to be problematic. In one aspect, this may be due to microscopic surface roughness. Another cause is elasticity of the surfaces that come into contact with each other. An elastic deformation can cause a loss of incommensurability, resulting in an increase in friction.

Accordingly, the present invention provides atomically smooth, hard, metallic glasses to provide low friction interfaces between components. The term "metallic glass" as used herein, describes an amorphous metal, that is, one that is non-crystalline, exhibiting a disordered (that is, no long-range order) atomic-scale structure. Metallic glasses are also typically more homogeneous than their crystalline counterparts because defects such as point defects, dislocations, and stacking faults are absent.

In an aspect of the invention, there provided a low-friction metallic film with an atomically smooth surface. The atomically smooth surface exhibits a surface roughness $R_a$ and a total height of profile $R_t$ of less than 0.1 nm and 0.15 nm, respectively. The atomically smooth metallic surface may be realized by in situ ion bombardment that serves as an extreme relaxation process for a metallic glass, particularly a thin film metallic glass deposited by magnetron sputtering. The atomically smooth surfaces of the metallic glass films are comparable to those of an ultraflat monocrystalline domain on highly oriented pyrolytic graphite and superior to commercial ultraflat silicon wafer surfaces. Ultralow friction, indicative of a superlubricity state, are exhibited by the atomically smooth metallic films, with a friction coefficient below $1 \times 10^{-2}$. As used herein, the term "superlubricity" relates to a contact between two surfaces where friction is eliminated/approximately eliminated.

The friction between the ultraflat metallic films of the present invention and two-dimensional materials is highly isotropic, without twist-angle dependent friction anisotropy. "Twist angle" describes an orientation during a frictional contact between surfaces where the adjacent surfaces are rotated out of registry with respect to each other. The friction is reduced in such surfaces that are "twisted" relative to each other. However, the surfaces of the present invention do not rely on this phenomenon and thus are termed as being isotropic without twist angle dependence.

The low-friction metallic films may be binary alloys. In particular, one component of the binary metal may be in the range of 45~64 atomic %. One binary alloy system that may be used is the copper-zirconium alloy system. Particular compositions include copper in an amount from 45-65 atomic percent and zirconium in an amount of 55-36 atomic percent. Other binary metal systems include the nickel-niobium alloy system. Particular compositions include nickel in an amount from 45-65 atomic percent and niobium in an amount of 55-36 atomic percent.

The metallic glasses may be fabricated by thin film deposition such as sputter deposition. Typical substrates include 100 silicon, metals, ceramics, and complex three-dimensional shapes such as MEMS devices and mechanical assemblies such as gears/joints, etc. In particular, magnetron sputtering may be used for deposition using alloy sputter targets. Importantly, a high level of ion bombardment of the growing metallic glass may be performed in order to create an ultrastable configuration, in which the glass system has been extremely relaxed and sufficiently reorganized. A substrate bias may be used to provide the ion bombardment.

The magnetron sputtering process includes the following parameters:

Vacuum pressure: $1 \times 10^{-6}$ ~ $5 \times 10^{-5}$ torr
Argon pressure: $1 \times 10^{-3}$ ~ $8 \times 10^{-3}$ torr
Substrate temperature: 288~370 K
Sputtering power: 40 to 500 W
Deposition rate: 1~20 nm/min
Substrate bias: 50V~150V Due to the sputtering technique of the present invention, the homogeneous ultralow-friction, ultraflat metallic glass may be formed over a large surface area and can be conformally formed on substrates with three-dimensional surface profiles (e.g., MEMS elements). The large surface area includes substrates of 8-10 cm in diameter.

The ultraflat metallic films exhibit much higher hardness and modulus than metallic films prepared by conventional methods. The hardness is at least approximately 10 GPa, and the modulus is greater than approximately 150 GPa. The ultraflat metallic films exhibits much higher thermodynamic and kinetic stabilities compared to the metallic glass films prepared by conventional method. FIG. 1 depicts differential scanning calorimetry heat flow curves of Cu—Zr metallic glass films deposited at different power of argon ion bombardment. In situ argon ion bombardment (AIB-note that other inert gases may also be used) during the deposition process markedly affects the thermodynamic behaviors of Cu—Zr metallic glass films, as the glass transition temperature ($T_g$) considerably increased with the power of argon ion bombardment (PAIB).

Figure 2:
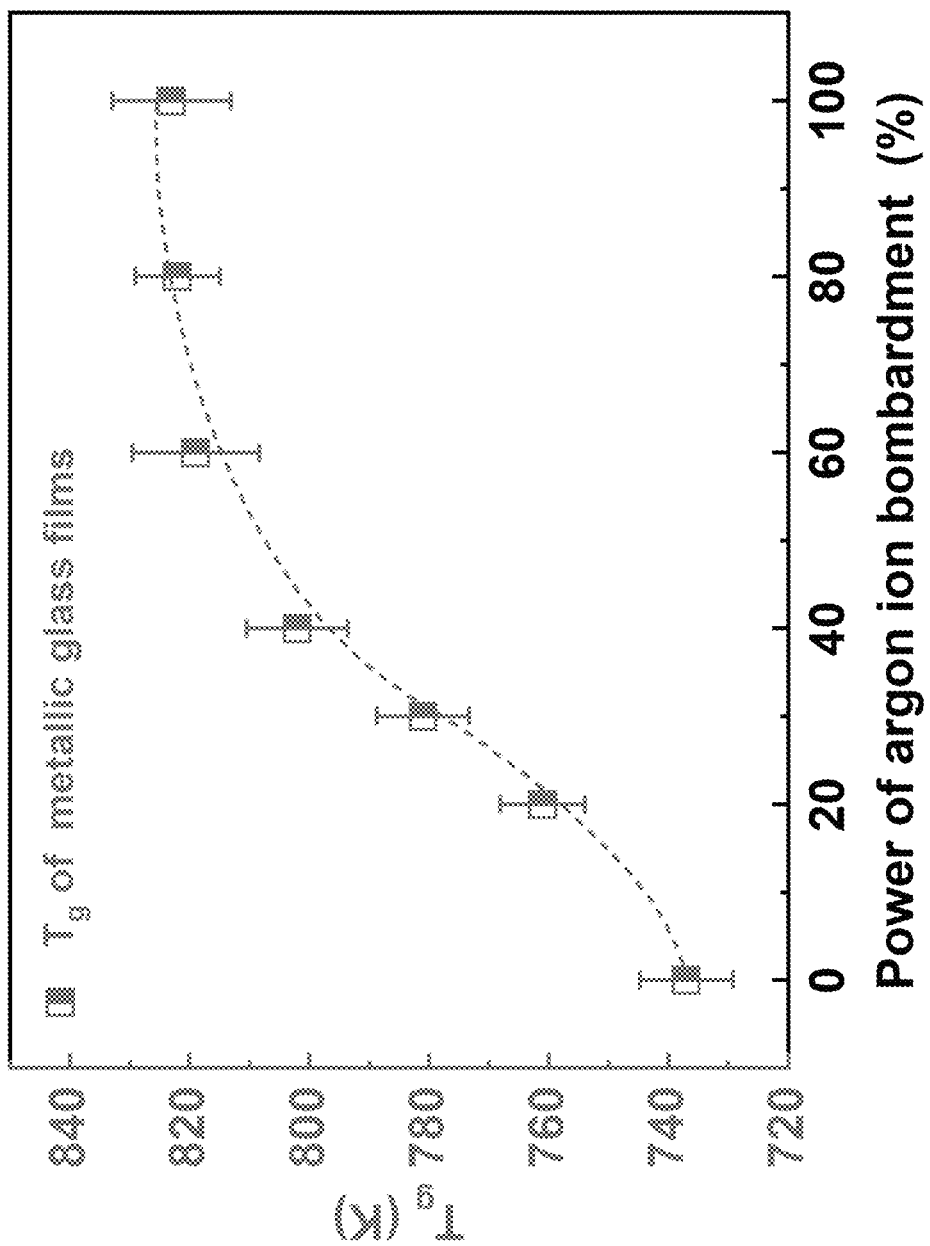
FIG. 2 show the dependence of glass transition temperature on the power of argon ion bombardment of Cu—Zr metallic glass films; the temperature error bars represent standard deviation obtained from five measurements.

FIG. 2 illustrates the dependence of $T_g$ on PAIB. The $T_g$ of the metallic glass film deposited without in situ AIB was 737 K, slightly less than that of melt-spun ribbon (742 K). At 100% PAIB, the $T_g$ of the metallic film was 823 K. In contrast, the variation in $T_g$ of the counterpart ribbon annealed at 700 K for 60 h was negligible. A large $\delta T_g$ is the main characteristic of an ultrastable configuration, in which the glass system has been extremely relaxed and sufficiently reorganized. Therefore, the metallic film prepared under a large PAIB, with a large $\delta T_g$ of 86 K, can be confirmed as a ultrastable metallic glass (UMG) resulting from the in situ—activated deposition. As used herein, the term "ultrastable" means the tendency to retain its amorphous configuration and resist a tendency towards an ordered structure.

Figure 3:
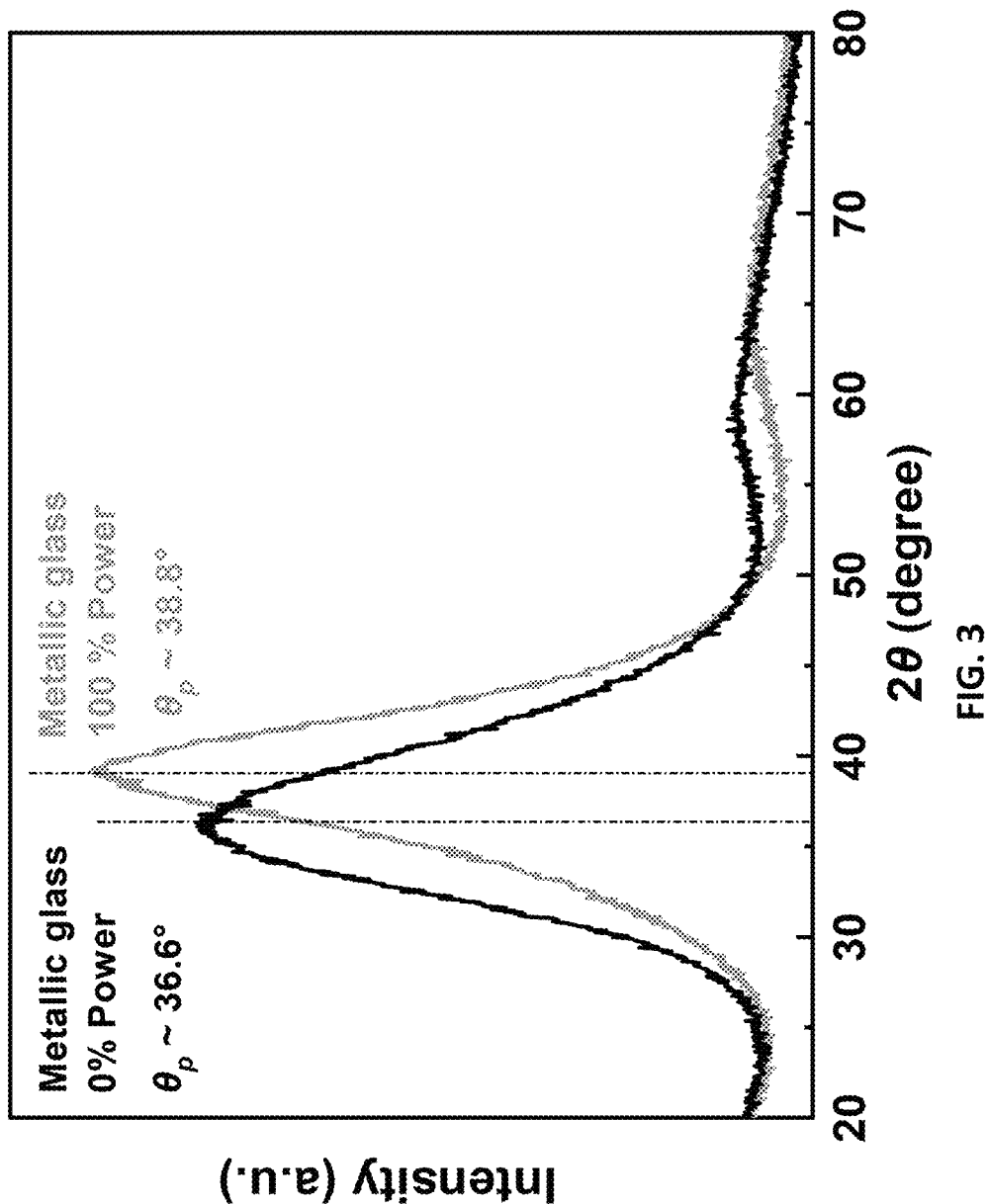
FIG. 3 shows x-ray diffraction spectra of a conventional Cu—Zr metallic glass film and the inventive metallic glass film deposited with 100% power of argon ion bombardment. The vertical dashed lines indicate the $1^{st}$ peak positions.
Figure 4A:
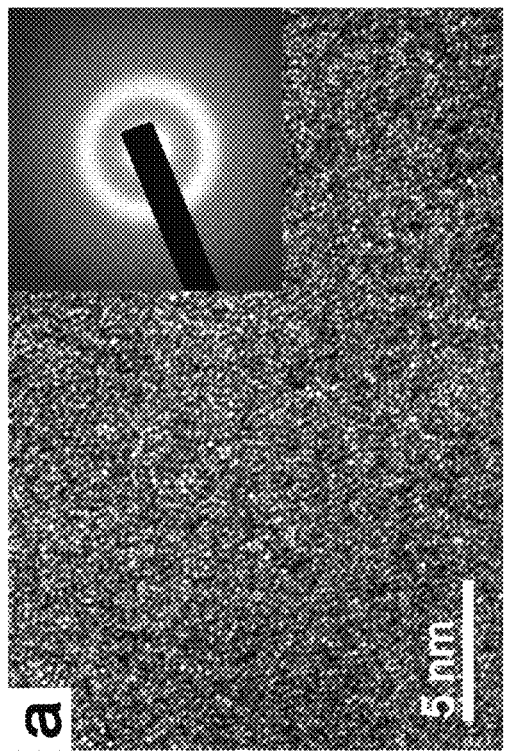
FIGS. 4a-4b are high-resolution TEM images of metallic glass films deposited with (4a) 0% power of argon ion bombardment and (4b) a metallic glass film deposited with 100% power of argon ion bombardment.
Figure 4B:
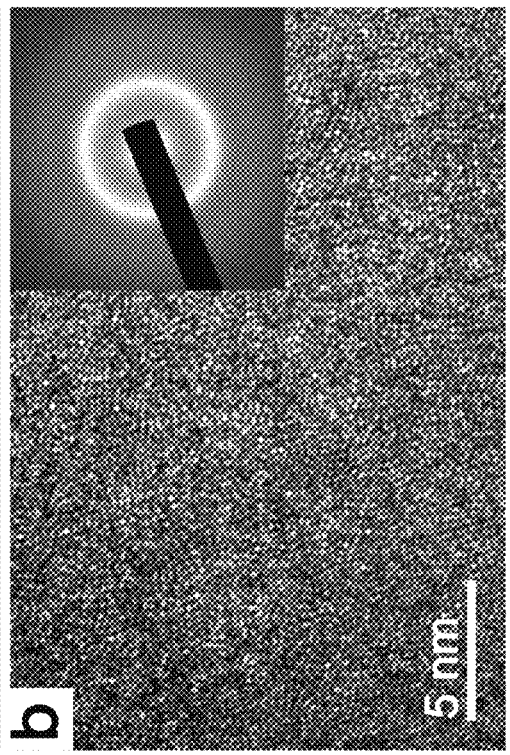

The structure of an in situ—activated ultrastable metallic glass film (e.g., a metallic glass film deposited at 100% PAIB) was characterised via transmission electron microscopy (TEM) and X-ray diffraction. The high-resolution TEM images of a conventional metallic glass film (FIG. 4a) and in situ—activated ultrastable metallic glass film (FIG. 4b) showed similar structural characteristics, i.e., homogeneous maze-like patterns. Signatures of nanocrystals or local ordered structures cannot be found in the TEM image of ultrastable metallic glass film relaxed via in situ—activated deposition. The amorphous diffraction ring of the ultrastable metallic glass film (inset) was much sharper than that of the conventional metallic glass film. This result agrees with the X-ray diffraction results: the first diffraction peak of UMG film shifted to the higher q—value direction, with higher intensity and smaller full width at half maximum than that of the conventional metallic glass (FIG. 3).

Figure 5:
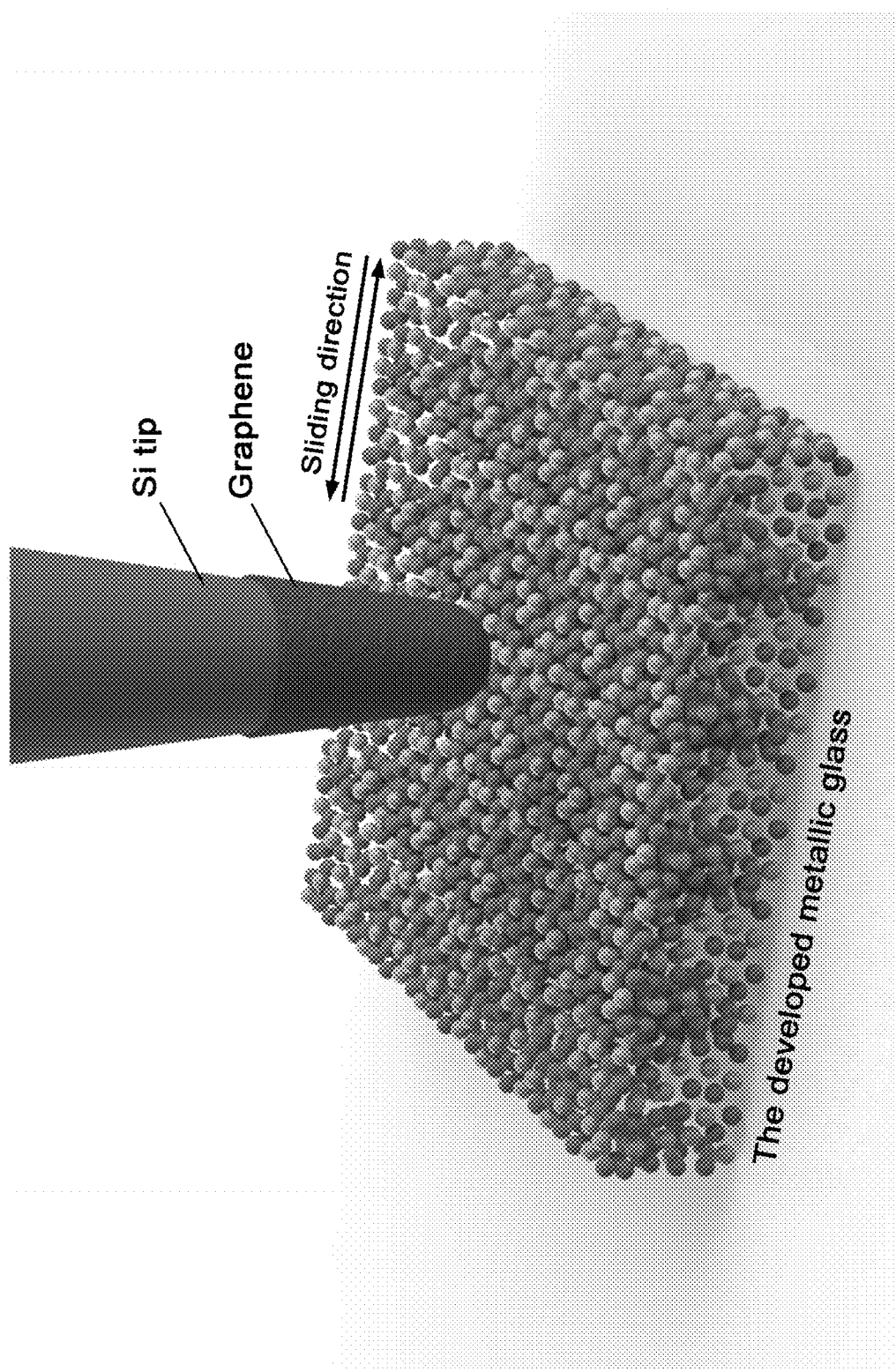
FIG. 5 is a schematic depiction of friction measurement between the developed metallic glass film and graphene.
Figure 6:
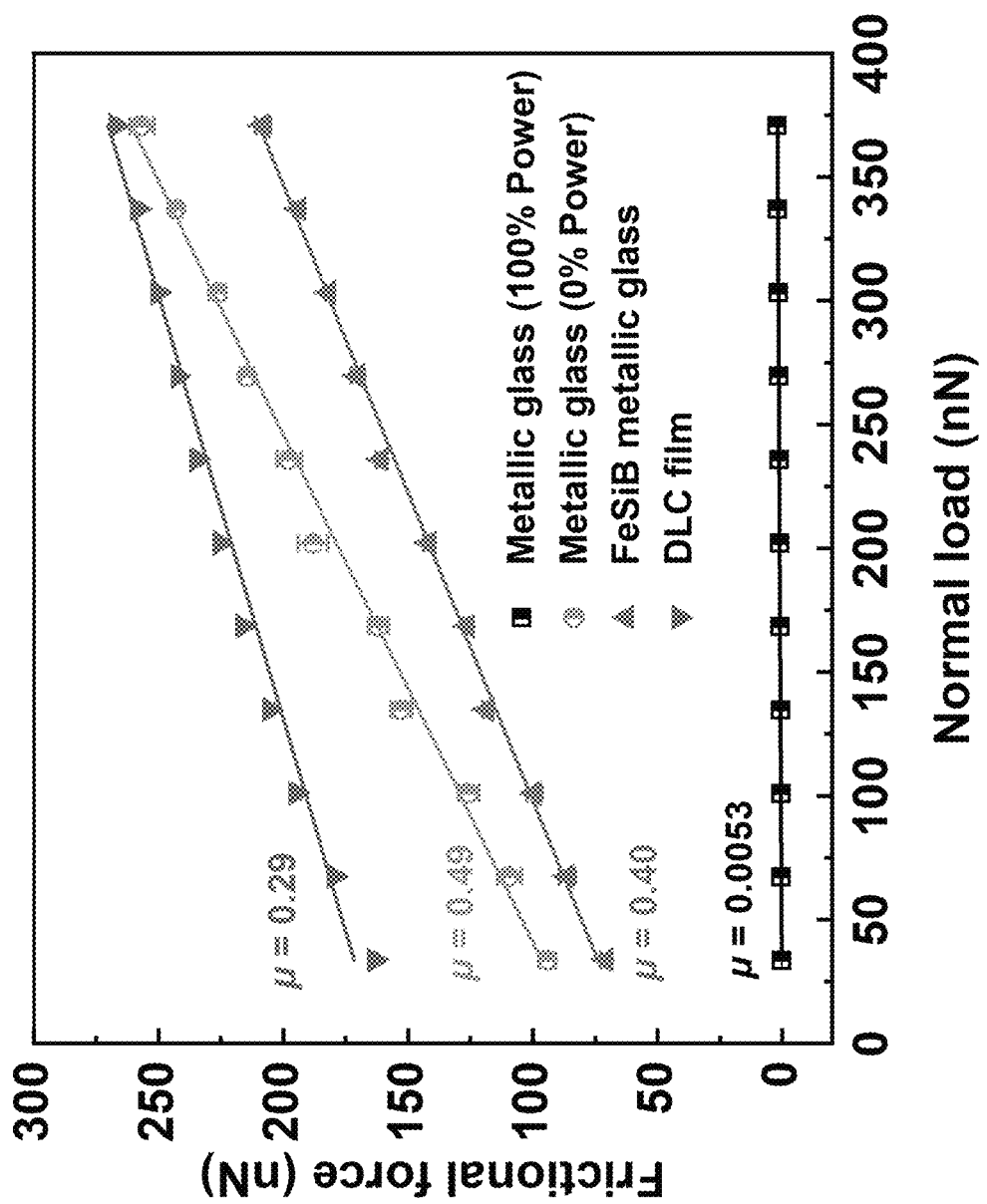
FIG. 6 depicts frictional force as a function of normal force for a graphene—wrapped AFM tip sliding on the developed metallic glass film, DLC film, prototypical Cu—Zr metallic glass film and FeSiB metallic glass film. The lines represent linear fits of the measured frictional force plots. The friction measurements were conducted in the ambient atmosphere, with the scan size and rate of 600 nm and 2 Hz, respectively.

To investigate the friction behavior between graphene and ultrastable metallic glass films, graphene-wrapped Atomic Force Microscopy (AFM) tips were slid across ultrastable metallic glass films. The experimental configuration is depicted in FIG. 5. FIG. 6 presents kinetic friction force between the graphene—wrapped tip and the metallic glass films. The kinetic friction force was linearly dependent on the normal force; therefore, the friction coefficient can be extracted from the slopes of the fitted lines. The friction coefficient of the graphene/metallic glass heterojunction was 0.0053, achieving a superlubricity state. In contrast, the friction coefficients of graphene/CuZr and graphene/FeSiB conventional metallic glasses were 0.49 and 0.40, respectively. Under the same test conditions, a diamond-like carbon (DLC) film, a widely studied antifriction and antiwear material, showed a friction coefficient of 0.29.

Figure 7:
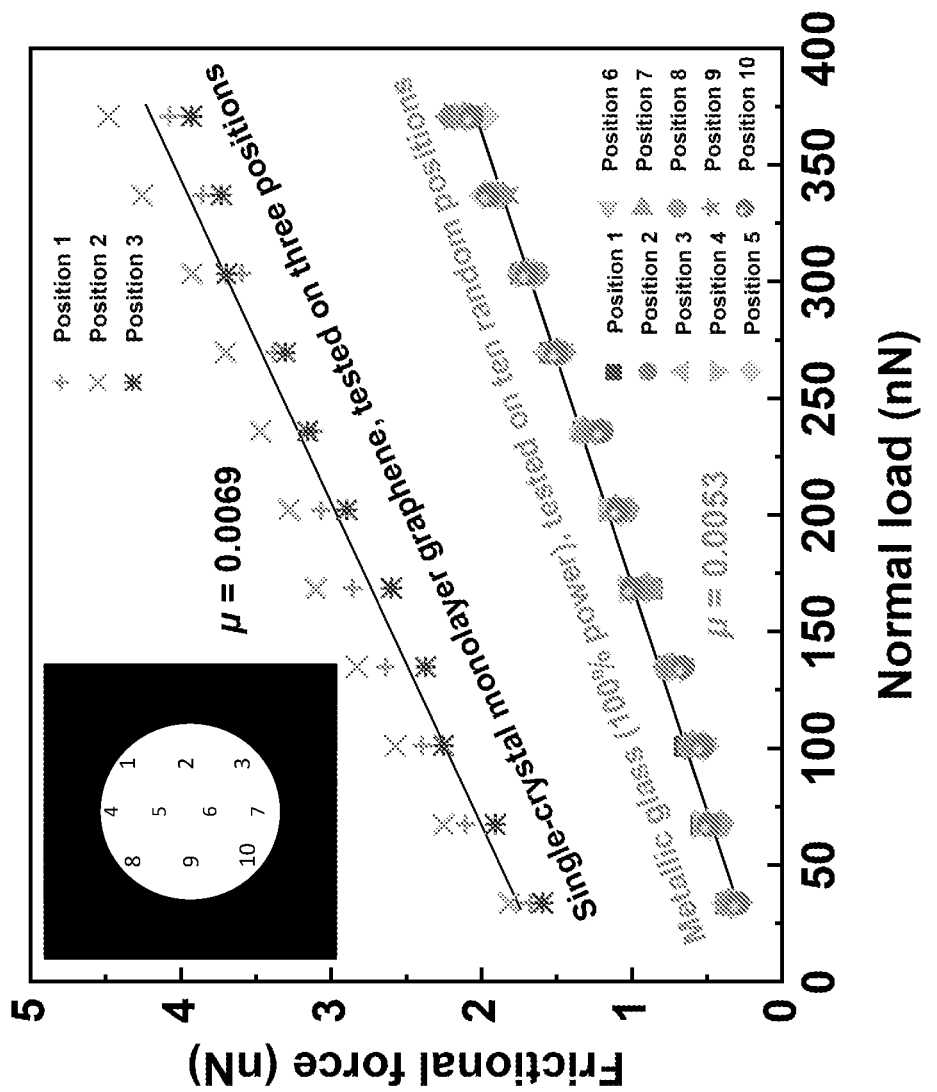
FIG. 7 shows successive frictional force tests for ten random positions on the 2—inch developed metallic glass film and single—crystal monolayer graphene (three positions). Inset: the optical image of the 2—inch UMG film and the 10 random test positions.

The extremely low frictional force, achieved by in situ—activated ultrastable metallic glass films, may be applied in mechanical engineering environments for low friction interfaces, resulting in energy conservation. To estimate the potential advantages of the ultrastable metallic glasses as large— area low—friction interfaces, a 2—inch diameter ultrastable metallic glass film was compared to a single—crystal monolayer graphene coating on a $SiO_2$/Si substrate. Using the same graphene—wrapped tip, 10 random positions were successively tested on the 2—inch ultrastable metallic glass film with a minimum separation distance of 5 mm. As shown in FIG. 7, all of the friction tests were highly reproducible, indicating excellent structural and frictional homogeneity of the large UMG film. Therefore, the ultrastable metallic glass can be formed as large rigid films for large scale low friction interfaces.

Figure 8:
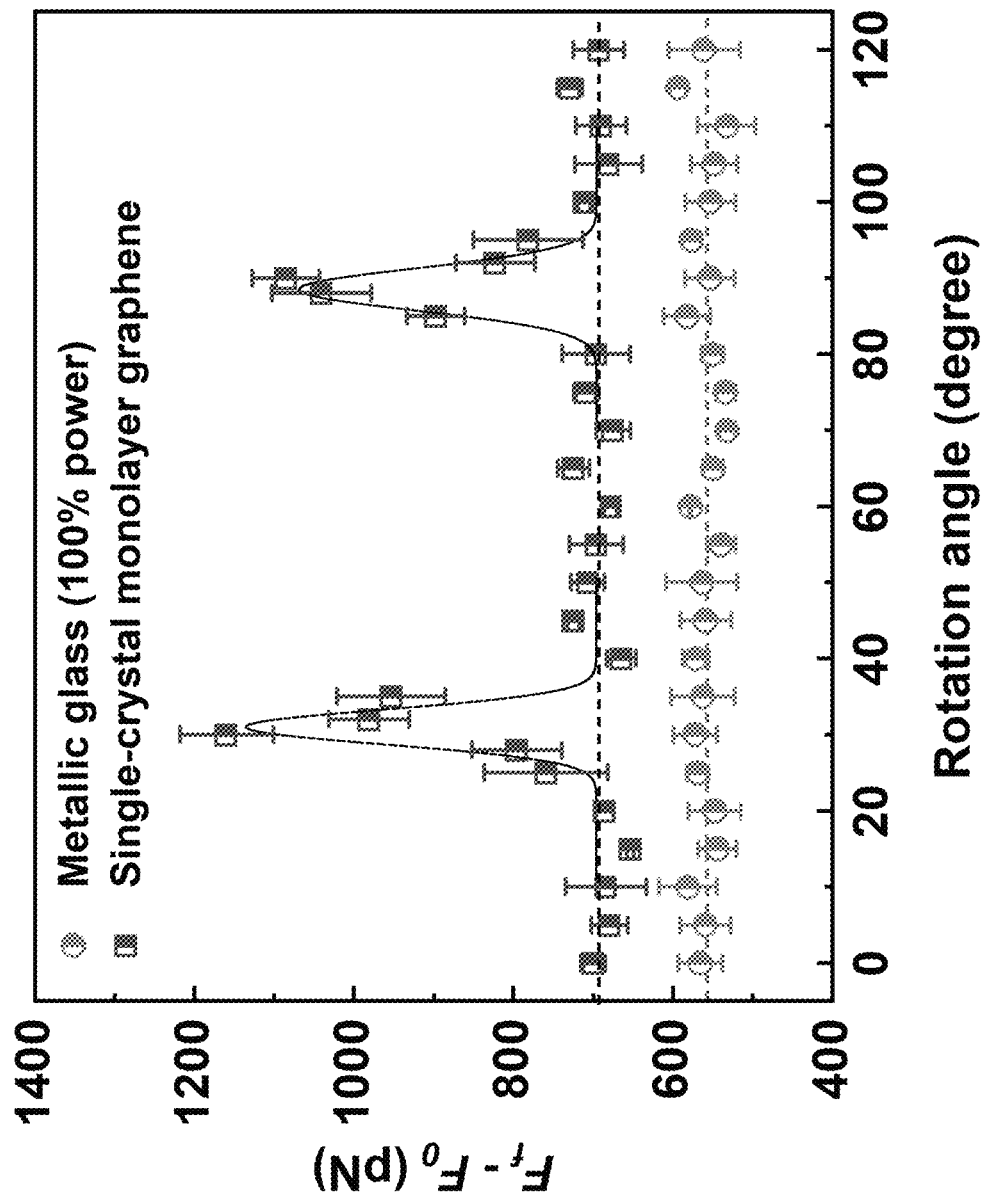
FIG. 8 shows the effect of twist angle on frictional force; both measurements were conducted using the same graphene—wrapped tip.

Another important factor in superlubricity applications is frictional isotropy, that is, independence from interfacial orientation. FIG. 8 shows the dependence of frictional force on twist angles between graphene—wrapped tips and both ultrastable metallic glass films and single—crystal monolayer graphene. The single—crystal monolayer graphene exhibited high—friction states at twist angle intervals of 57.5°. The friction anisotropy between the graphene—wrapped tip and single—crystal monolayer graphene confirms the monocrystallinity of the contacting surfaces, indicating the relatively perfect hexagonal structure of graphene flake wrapped around the AFM tip. In contrast, the frictional force of graphene/ultrastable metallic glass heterojunction remained almost constant, suggesting no dependence on twist angle. Therefore, the graphene/ultrastable metallic glass heterojunction may exhibit homogeneous ultralow friction, regardless of interfacial orientation.

Figure 9:
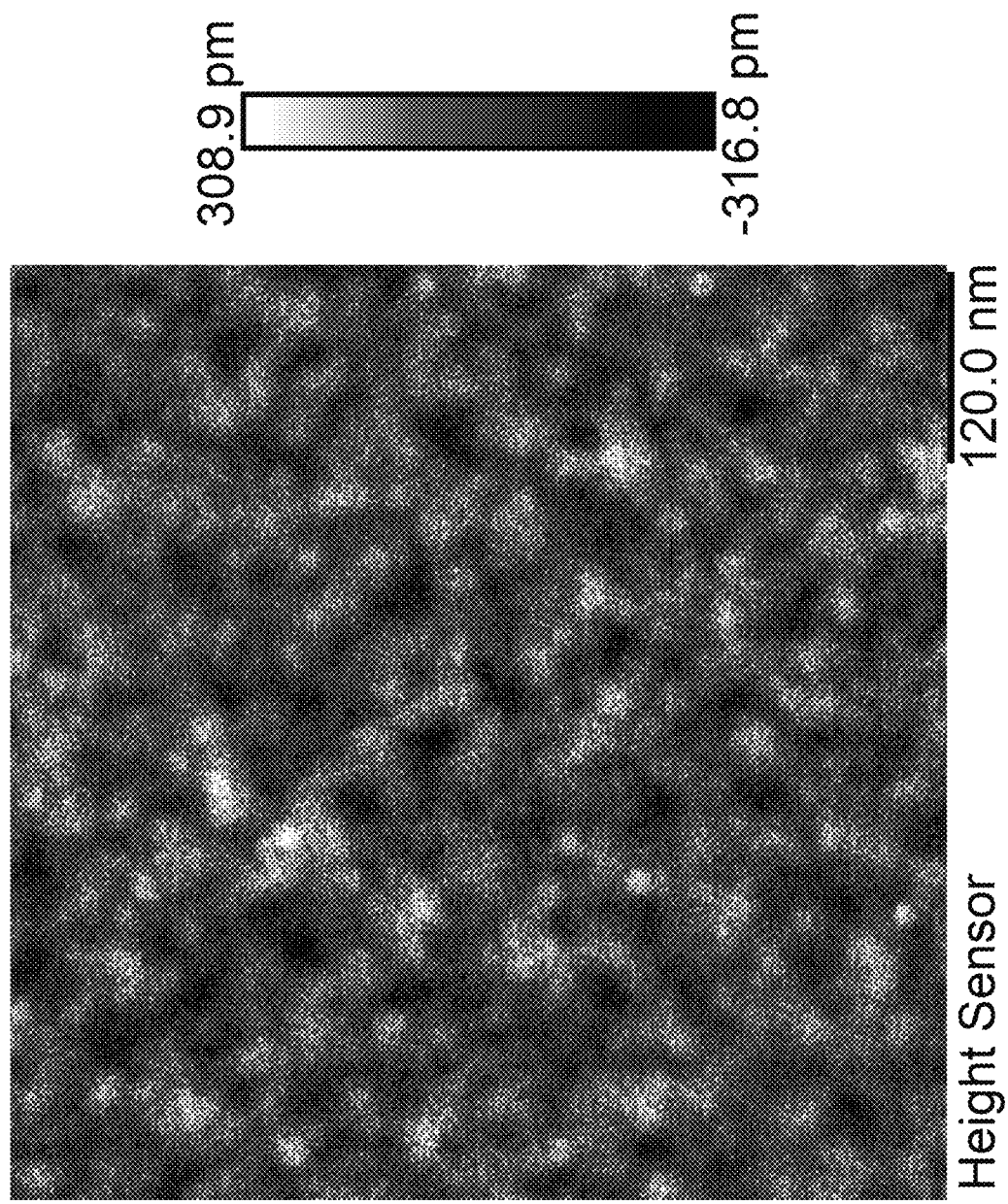
FIG. 9 depicts the surface morphologies of a metallic glass film deposited with 100% power of argon ion bombardment.
Figure 10:
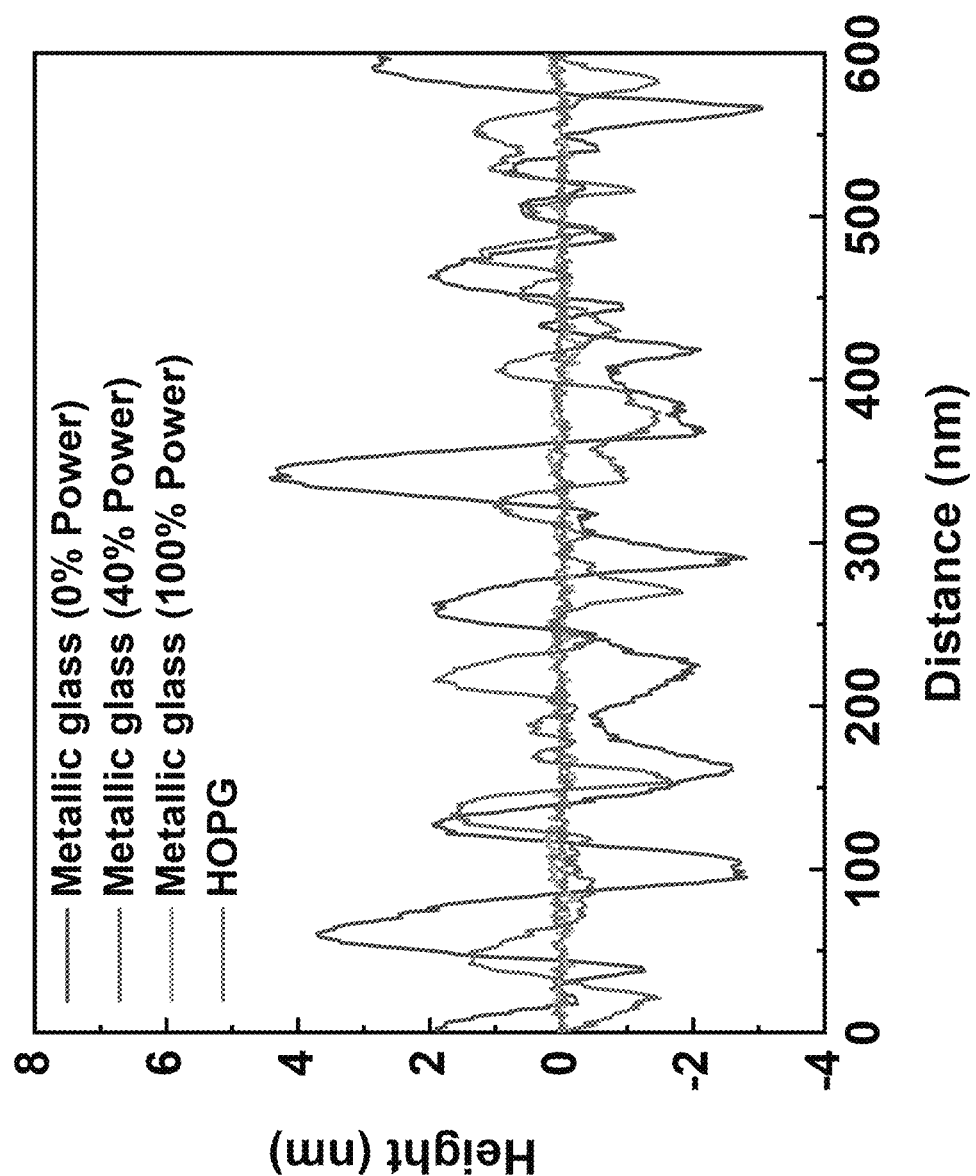
FIG. 10 shows section profiles of sample surfaces; scanning length is 600 nm.
Figure 11:
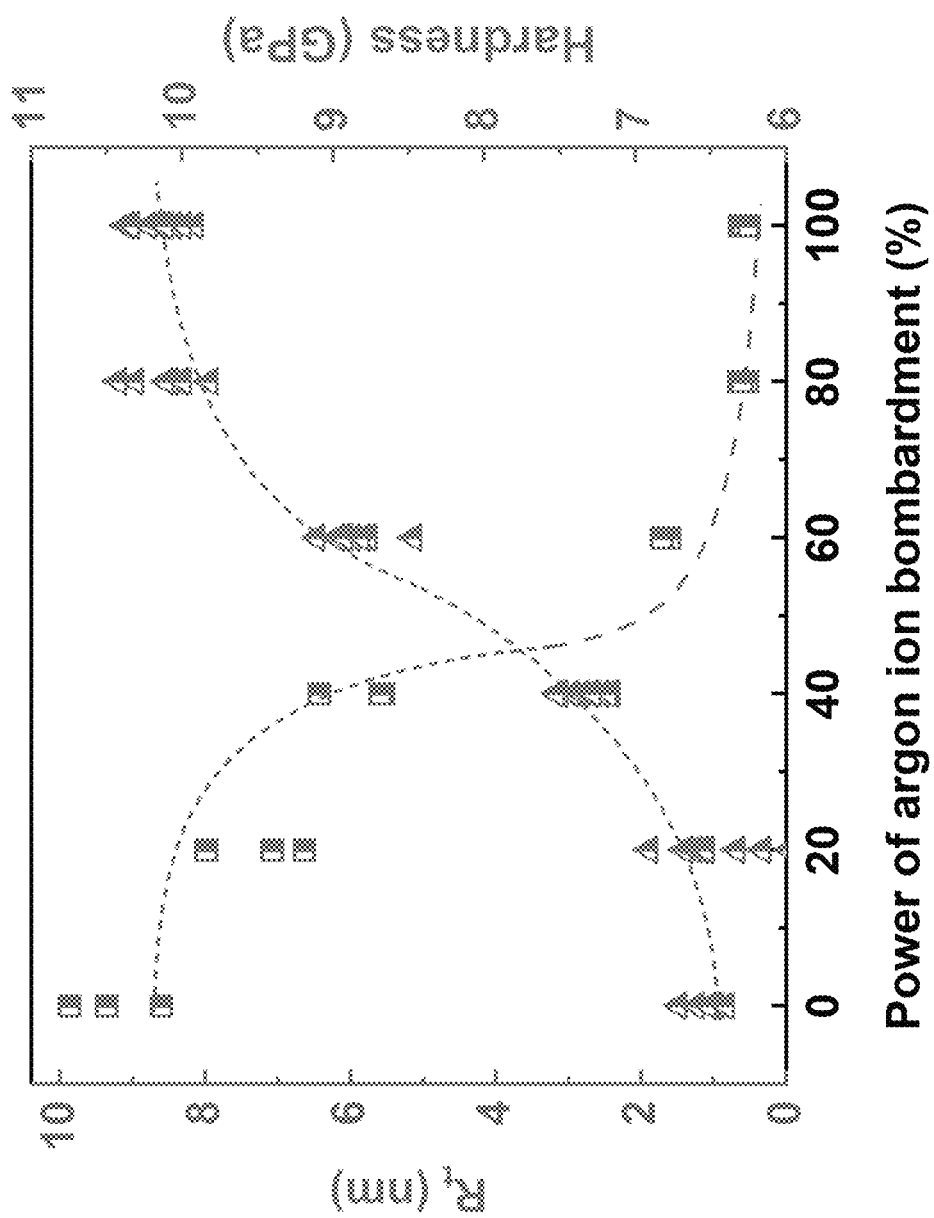
FIG. 11 shows the $R_t$ and hardness of metallic glasses as a function of the power of argon ion bombardment.
Figure 12:
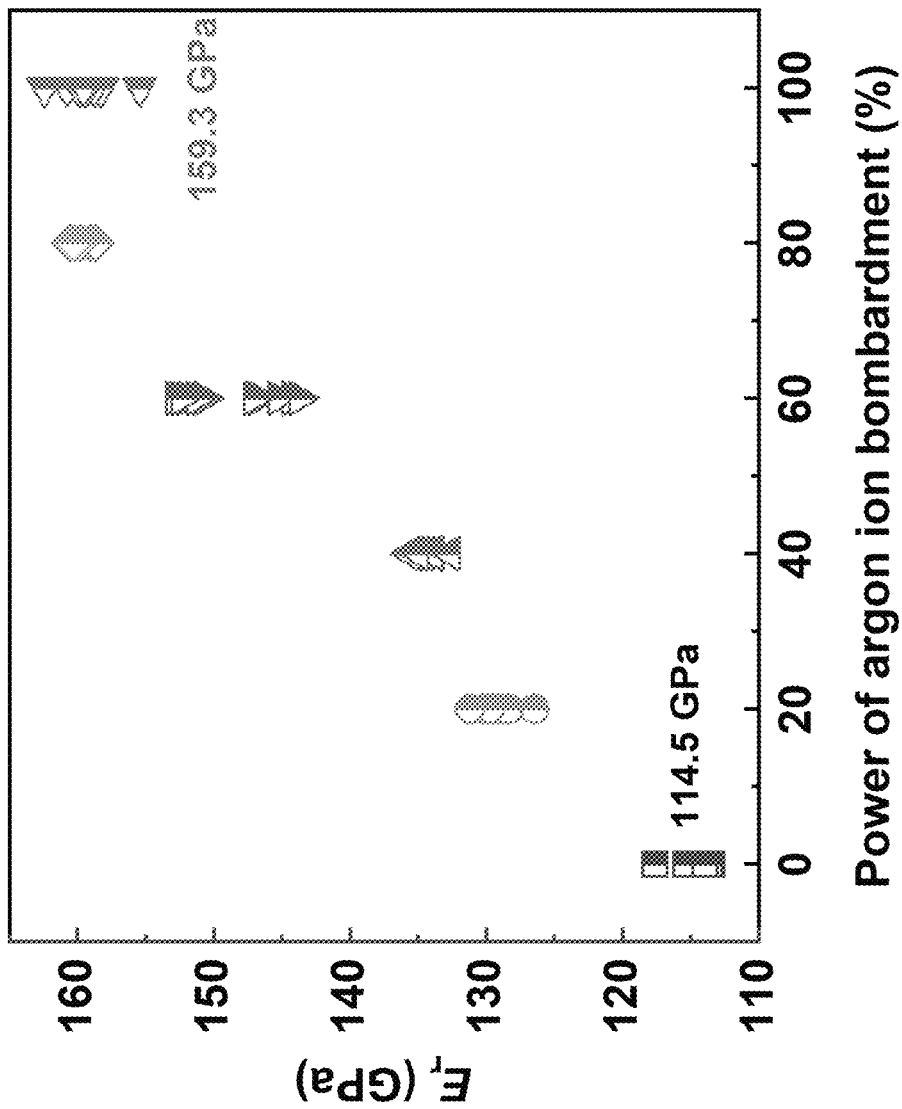
FIG. 12 shows the modulus of the metallic glasses as a function of the power of argon ion bombardment.

FIG. 9 presents in situ AIB—induced variations in the surface topography of metallic glasses. The in situ—AIB endowed the ultrastable metallic glass with an atomically smooth surface, which is even comparable to that of an ultraflat monocrystalline domain on highly-oriented pyrolytic graphite (HOPG) (FIG. 10). The effects of in situ-AIB on the total height of profile ($R_t$) and hardness of metallic glasses are summarized in FIG. 11. The in situ—activated ultrastable metallic glass exhibited lower $R_t$ and higher hardness (0.58 nm and 10.1 GPa, respectively) than the conventional sample (9.27 nm and 6.5 GPa, respectively). Moreover, the modulus of ultrastable metallic glass (159.3 GPa) is higher than that of the conventional metallic glass (114.5 GPa, FIG. 12). Therefore, the in situ—activated ultrastable metallic glass provided an atomically smooth surface with high hardness and modulus to sustain against the sliding of graphene.

EXAMPLES

Sample preparation. Metallic glasses with nominal compositions of Cu (45~64 atomic %) Zr (55~36 atomic %) are deposited via magnetron sputtering. The in-situ argon ion bombardment is realized by modulation of substrate bias. The elements of the targets are not limited to only Cu and Zr. Alternatively, the composition of the target is Ni (45~64 at. %) Nb (55~36 at. %). The films were deposited on Si(001) wafers with a deposition rate of 1-20 nm per minute. The base pressure of the sputtering chamber is about $1 \times 10^{-6}$~$5 \times 10^{-5}$ torr, and argon pressure was $1 \times 10^{-3}$ ~$8 \times 10^{-3}$ torr. The temperature of the water-cooled deposition platen was 288~370 K. The alloy ingot was prepared by arc-melting high-purity materials and then the counterpart metallic glass ribbons with a thickness of about 20 μm were fabricated by melt-spinning technique.

Thermodynamic and structural characterization. DSC tests of MG films were conducted on the NETZSCH STA 449 apparatus with a heating rate of 20 K $min^{-1}$ in the argon gas flow. The DSC measurements were performed at least three times for each sample to statically calculate characteristic temperatures. The structure of the as-deposited and annealed films was examined by the laboratory X-ray diffraction (Rigaku SmartLab) to analyze the difference in peak position and identify the crystalline phase. The atom-scaled structural characterization of the films was analyzed by TEM (JEM 2100F FEG), operated at 200 kV. The TEM samples were carefully prepared by the focused ion beam technique (FEI Scios) with the finally milling voltage/current of 2 kV/34 pA to avoid crystallization.

Friction measurement. The friction measurements were performed on the Dimension Icon (Bruker) AFM instrument under ambient atmosphere. The test temperature was about 25° C., and the relative humidity was 55~65%. The graphene wrapped AFM tip was scanned on the glass films under a reciprocating mode with a scan size of 600 nm and a scan rate of 1.2 μm $s^{-1}$. The friction force was calculated as the average energy dissipation by taking the derivative on the area of friction force loops with respect to the scan distance. Each value of friction force was averaged on 20 friction force loops. The normal spring constant of the employed AFM probe (PPP-FMR, Nanosensors) was calibrated by the Sader method, and the lateral spring constant was calibrated by the grating method. A highly ordered pyrolytic graphite (ZYA grade from ASC Material) was freshly exposed by Scotch tape (3M) to yield a clean and atomically flat surface for the friction tests. A monolayer single-crystalline graphene transferred on a $SiO_2$/Si substrate (XFNANO) was employed to compare the friction behavior with the ultrastable metallic glass.

Surface characterization. The surface topography of the metallic glass films and HOPG was measured by the supersharp AFM tip (SHR150, Budgetsensors) under a tapping mode. The graphene wrapped tip (PPP-LFMR, Nanosensors) without the pre-sliding process was applied to measure the adhesive force. The graphene wrapped tip was first pushed down to contact with the studied material and then detached from the surfaces. The adhesive force was extracted as the pull-off force from the retrace curves. The cumulative distribution of adhesive force was obtained by measuring 144 points with an interval distance of 100 nm for each sample.

The preparation of the graphene wrapped AFM tip.

Pristine tips were firstly pre-slid on the freshly exfoliated HOPG surfaces, to blunt the tip apex with a prominent decrease in radius from 8 nm to approximately 30 nm. The pre-sliding process facilitates to smooth the tip surfaces and to obtain relatively identical tip geometry. The blunt AFM tips scanned the area containing plenty of graphene flakes or terrace edges of graphene flakes on the HOPG surface under contact mode. The graphene flakes rolled up and detached from the HOPG substrate during the scanning process, and the tip-exfoliated graphene sheets tend to spontaneously wrap around the tip apex due to the relatively large adhesive force between silicon and graphene. Another crucial evidence of the successful transfer of graphene around the tip apex is the significant decrease in the friction coefficients with HOPG after the tip-graphene transfer process. Each AFM tip experienced the graphene-transfer was tested the friction coefficient with HOPG to ensure the successful transfer of graphene, and then was applied to further friction tests.

As used herein, terms "approximately", "basically", "substantially", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the present disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of the present disclosure and features of details are briefly described above. The embodiments described in the present disclosure may be easily used as a basis for designing or modifying other processes and structures for realizing the same or similar objectives and/or obtaining the same or similar advantages introduced in the embodiments of the present disclosure. Such equivalent construction does not depart from the spirit and scope of the present disclosure, and various variations, replacements, and modifications can be made without departing from the spirit and scope of the present disclosure.

The invention claimed is:

1. An ultraflat and ultralow-friction metallic glass thin film, the metallic glass thin film being a binary alloy, wherein a content of a first metal element of the binary alloy is between 45 atomic % and 64 atomic %, the metallic glass thin film having an atomically smooth surface with a surface roughness $R_a$ less than 0.1 nm and a total height of profile $R_t$ less than 0.15 nm and a friction coefficient below $1\times10^{-2}$, the metallic glass thin film being treated by ion bombardment such that it is thermally ultrastable;

and wherein the first metal element is copper or nickel and a second metal element is zirconium or niobium, such that the binary alloy is a copper-zirconium binary alloy or a nickel-niobium binary alloy.

2. The ultraflat and ultralow-friction metallic glass thin film recited in claim 1, further comprising a substrate.

3. The ultraflat and ultralow-friction metallic glass thin film recited in claim 2, wherein the substrate is selected from a metal surface, silicon, mica, a micro-electromechanical systems (MEMS) device, or a frictional surface of a mechanical assembly.

4. The ultraflat and ultralow-friction metallic glass thin film recited in claim 1, having a glass transition temperature of at least 820K.

5. The ultraflat and ultralow-friction metallic glass thin film recited in claim 1, having a hardness of at least 10 GPa and a Young's modulus of at least 150 GPa.

6. The ultraflat and ultralow-friction metallic glass thin film recited in claim 1, wherein the film has a surface area of greater than 2000 square millimeters.

7. A frictional interface with superlubricity and exhibiting frictional isotropy comprising a first interface including the ultraflat and ultralow-friction metallic glass thin film recited in claim 1, and a second interface contacting the first interface including a surface selected from the ultraflat and ultralow-friction metallic glass thin film recited in claim 1, graphite, graphene, $MoS_2$, hexagonal boron nitride, or $WS_2$.

8. A method of making the ultraflat and ultralow-friction metallic glass film recited in claim 1, comprising magnetron sputtering from a binary alloy target, wherein a content of a first metal element of the binary alloy target is between 45 atomic % and 64 atomic %, and a substrate bias is between 50V and 150V;

and wherein the firs metal element is copper or nickel and a second metal element is zirconium or niobium, such that the binary alloy is a copper-zirconium binary alloy or a nickel-niobium binary alloy.

9. The method of claim 8, wherein a deposition pressure is $1\times10^{-3} \sim 8\times10^{-3}$ torr.

10. The method of claim 8, wherein a deposition temperature is 288~370 K.

* * * * *